(12) United States Patent
Montero et al.

(10) Patent No.: US 10,916,280 B2
(45) Date of Patent: Feb. 9, 2021

(54) SECURELY SHARING A MEMORY BETWEEN AN EMBEDDED CONTROLLER (EC) AND A PLATFORM CONTROLLER HUB (PCH)

(71) Applicant: Dell Products, L.P., Round Rock, TX (US)

(72) Inventors: Adolfo S. Montero, Pflugerville, TX (US); Mark Tracy Ellis, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 173 days.

(21) Appl. No.: 15/922,694

(22) Filed: Mar. 15, 2018

(65) Prior Publication Data

US 2019/0287588 A1    Sep. 19, 2019

(51) Int. Cl.
  *G11C 8/20* (2006.01)
  *G11C 7/10* (2006.01)

(52) U.S. Cl.
  CPC .............. *G11C 8/20* (2013.01); *G11C 7/1018* (2013.01); *G11C 7/1072* (2013.01); *G11C 2207/104* (2013.01)

(58) Field of Classification Search
  CPC ....... G11C 7/1082; G11C 7/1072; G11C 8/20; G06F 1/32; G06F 9/44

USPC ............................................................. 713/2
See application file for complete search history.

(56) References Cited

U.S. PATENT DOCUMENTS

| | | | | |
|---|---|---|---|---|
| 5,579,493 A * | 11/1996 | Kiuchi | ...................... | G06F 1/32 |
| | | | | 712/207 |
| 5,819,087 A * | 10/1998 | Le | ......................... | G06F 9/4401 |
| | | | | 713/2 |
| 6,532,587 B1 * | 3/2003 | Sakai | ....................... | G06F 8/66 |
| | | | | 711/102 |
| 2002/0166061 A1 * | 11/2002 | Falik | ................... | G06F 12/1425 |
| | | | | 726/34 |
| 2006/0277401 A1 * | 12/2006 | Sultenfuss | ............... | G06F 8/65 |
| | | | | 713/1 |
| 2015/0331754 A1 * | 11/2015 | Grobelny | ............... | G06F 9/441 |
| | | | | 714/23 |
| 2017/0161497 A1 * | 6/2017 | Jeansonne | .............. | G06F 21/57 |

\* cited by examiner

*Primary Examiner* — Keshab R Pandey
(74) *Attorney, Agent, or Firm* — Fogarty LLP

(57) ABSTRACT

Systems and methods for securely sharing a memory between an Embedded Controller (EC) and a Platform Controller Hub (PCH). In some embodiments, an IHS may include: a chipset; a flash device coupled to the chipset; and an EC coupled to the flash device via a first bus and to the chipset via a second bus, wherein the EC comprises a Read-Only Memory (ROM) portion and a Random Access Memory (RAM) portion, the EC configured to: retrieve EC firmware from the flash device via the first bus; store the retrieved EC firmware in the RAM portion; and prior to the execution of any instruction stored in the RAM portion, relinquish access to the flash device via the first bus.

14 Claims, 3 Drawing Sheets

SECURELY SHARING A MEMORY BETWEEN AN EMBEDDED CONTROLLER (EC) AND A PLATFORM CONTROLLER HUB (PCH)

FIELD

The present disclosure generally relates to Information Handling Systems (IHSs), and, more particularly, to systems and methods for securely sharing a memory between an Embedded Controller (EC) and a Platform Controller Hub (PCH).

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and components may vary between different applications, IHSs may also vary regarding what information is handled, how the information is handled, how much information is processed, stored, or communicated, and how quickly and efficiently the information may be processed, stored, or communicated. Variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Inside an IHS, interfaces may be provided for input/output (I/O) devices to communicate with each other. One such interface is the Serial Peripheral Interface (SPI). The SPI interface enables exchange of data between a master device and a slave device. In an IHS, a Platform Controller Hub (PCH) or chipset can be set as a master device, and an SPI flash memory device ("SPI flash") can be set as a slave device, for example.

Another type of I/O interface is the Enhanced SPI Bus (eSPI). Despite the similar nomenclature, the SPI and eSPI interfaces are different. In eSPI, for example, a slave (e.g., an Embedded Controller or EC) may be allowed to use a master (e.g., a PCH) as a proxy or arbitrator, such that a PCH master device can perform operations on an SPI flash at the request of an EC slave device.

SUMMARY

Embodiments of systems and methods for securely sharing a memory between an Embedded Controller (EC) and a Platform Controller Hub (PCH) are described. In an illustrative, non-limiting embodiment, an IHS may include: a chipset; a flash device coupled to the chipset; and an EC coupled to the flash device via a first bus and to the chipset via a second bus, where the EC comprises a Read-Only Memory (ROM) portion and a Random Access Memory (RAM) portion, and where the EC is configured to: retrieve EC firmware from the flash device via the first bus; store the retrieved EC firmware in the RAM portion; and prior to the execution of any instruction stored in the RAM portion, relinquish access to the flash device via the first bus.

In various implementations, the chipset may be a Platform Controller Hub (PCH). The first bus may be a Serial Peripheral Interface (SPI) bus, and the second bus may be an Enhanced SPI bus (eSPI). Moreover, the EC firmware may include trusted EC code and untrusted processor code.

In some cases, the IHS may include multiplexing circuitry configured to control access by the EC to the flash device over the first bus. Additionally, or alternatively, the IHS may include counter circuitry coupled to the EC and configured to end EC access to the flash device via the first bus. For example, such counter circuitry may be configured to end EC access to the flash device after the passing of a selected number of clock cycles corresponding to a number of clock cycles of a ROM execution phase.

The EC may be further configured to, after termination of the ROM execution phase, and prior to any subsequent power-up cycle, access the flash device exclusively via the second bus through the chipset.

In another example, the IHS may be configured to receive, at the RAM portion, firmware stored on the flash device coupled to the EC via the first bus, where the firmware comprises: (i) trusted EC code; and (ii) untrusted processor code. The IHS may be further configured to execute the trusted EC code and to relinquish access to the flash device via the first bus prior to execution of the untrusted processor code. After termination of the trusted EC code, the EC may be configured to access the flash device exclusively via the second bus.

In another illustrative, non-limiting embodiment, a method may implement one or more of the aforementioned operations. In yet another illustrative, non-limiting embodiment, a hardware memory device may have program instructions stored thereon that, upon execution by an IHS, cause the IHS to perform one or more of the aforementioned operations.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below.

Figure 1:
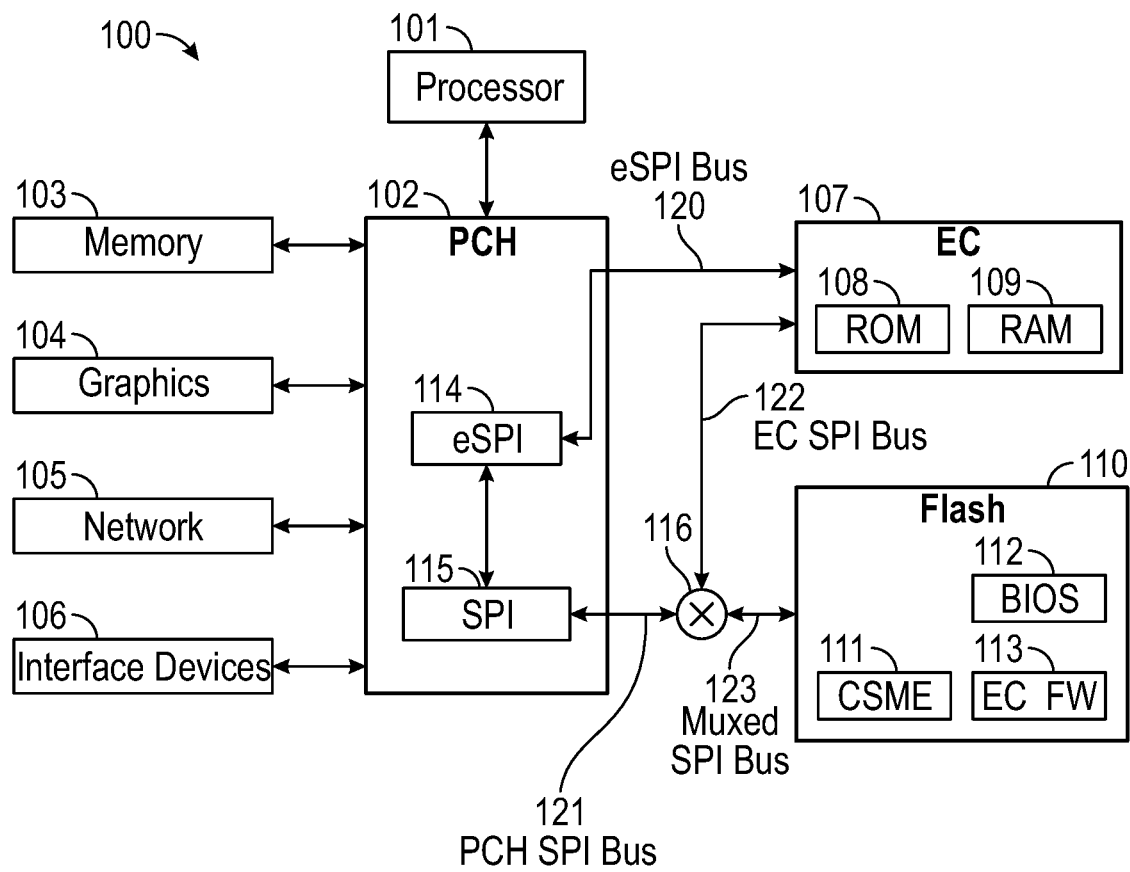
FIG. 1 illustrates examples of components of an Information Handling System (IHS), according to some embodiments.

FIG. 1 illustrates an example of components of IHS 100, according to some embodiments. As shown, IHS 100 includes processor 101. In various embodiments, IHS 100 may be a single-processor system, or a multi-processor system including two or more processors. Processor 101 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes Platform Controller Hub (PCH) or chipset 102, which may comprise one or more integrated circuits (ICs) coupled to processor 101. In certain embodiments, PCH 102 may utilize a QuickPath Interconnect (QPI) bus to communicate with processor 101. PCH 102 provides processor 101 with access to a variety of resources. For instance, PCH 102 provides access to system memory 103. System memory 103 may be configured to store program instructions and/or data accessible by processor 101. In various embodiments, system memory 103 may be implemented using any suitable memory technology, such as static RAM (SRAM), dynamic RAM (DRAM) or magnetic disks, or any nonvolatile/Flash-type memory, such as a solid state drive (SSD) or the like.

PCH 102 may also provide access to graphics processor 104. In certain embodiments, graphics processor 104 may be part of one or more video or graphics cards installed as components of IHS 100. Graphics processor 104 may be coupled to PCH 102 via a graphics bus such as provided by an AGP (Accelerated Graphics Port) bus or a PCIe (Peripheral Component Interconnect Express) bus. In certain embodiments, a graphics processor 104 generates display signals and provides them to a monitor or other display device.

Other resources may also be coupled to processor 101 through PCH 102. For instance, PCH 102 may be coupled to network interface 105, such as a Network Interface Controller (NIC). In certain embodiments, network interface 105 may be coupled to PCH 102 via a PCIe bus or the like, and it may support communication via various wired and/or wireless networks. User interface device(s) 106 may include a keyboard, trackpad, camera, remote control, or any other device configured to enable a human user to interact with IHS 100.

Embedded Controller (EC) 107 may be coupled to Enhanced Serial Peripheral Interface (eSPI) module 114 of PCH 102 over eSPI bus 120. Typically, EC 107 may be implemented as a microcontroller that handles tasks that the IHS's Operating System (OS) does not handle, such as receiving and processing signals from a keyboard, turning the IHS on and off, thermal measurement and response, controlling visual indicators, managing a battery, allowing remote diagnostics, service, and remediation, etc. In this particular implementation, EC 107 operates with two distinct types of dedicated, internal memories: ROM portion 108 and RAM portion 109.

Figure 2:
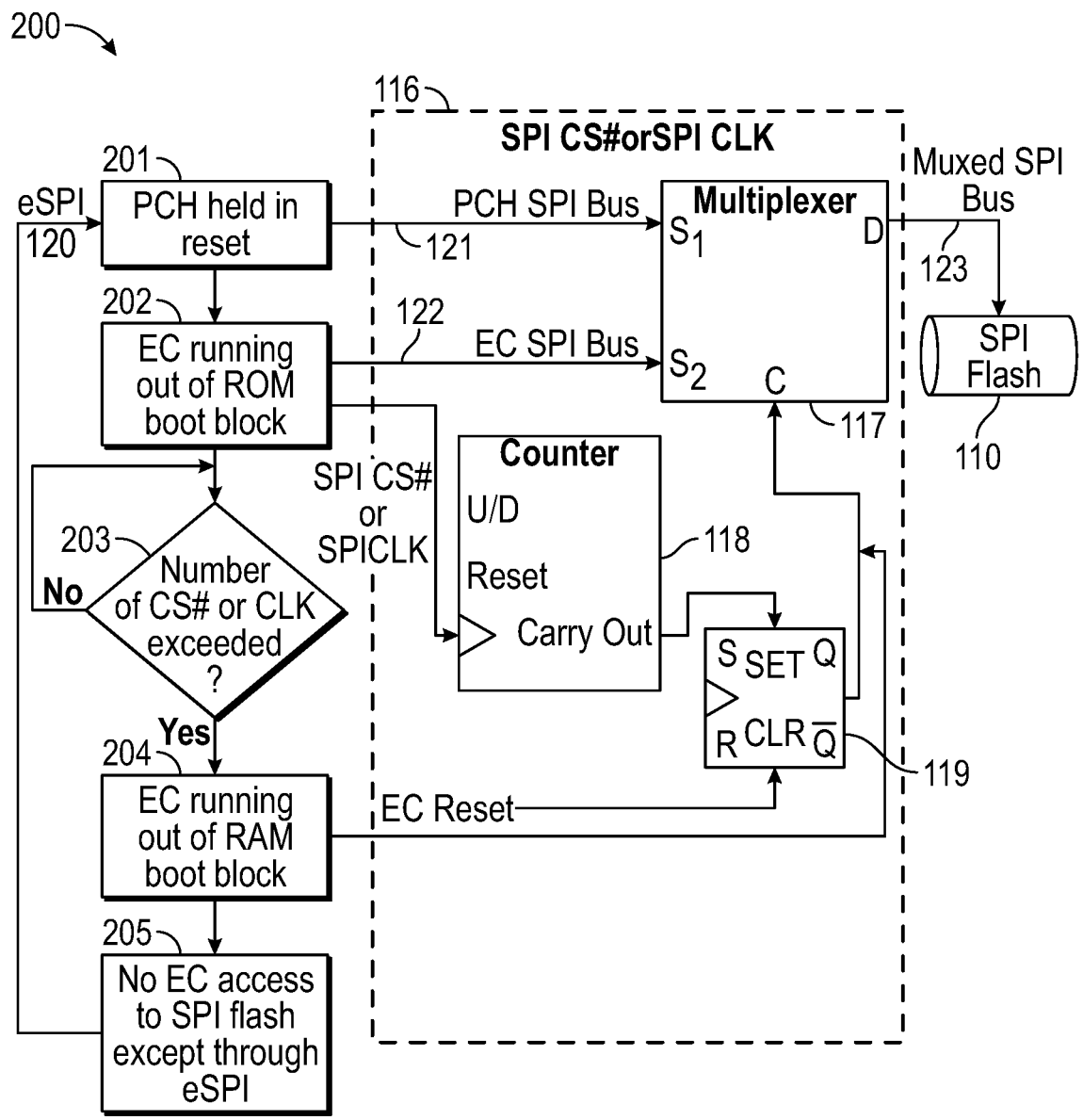
FIG. 2 illustrates an example of a method for securely sharing a memory between an Embedded Controller (EC) and a Platform Controller Hub (PCH) using multiplexing circuitry, according to some embodiments.

SPI flash 110 includes a non-volatile memory device capable of being electrically erased and reprogrammed. In this case, SPI flash 110 is coupled to SPI module 115 of PCH 102 over PCH SPI bus 121, and to EC 107 over EC SPI bus 122. PCH SPI bus 121 and EC SPI Bus 122 are multiplexed into muxed SPI bus 123 via multiplexing circuit 116, an example of which is shown in FIG. 2.

SPI flash 110 may include any number of partitions, and each partition may hold instructions or data for a different component of IHS 100. For instance, Converged Security and Management Engine (CSME) code 111 enables processor 101 (or another controller) to perform a security operations, Basic Input/Output System (BIOS) or Unified Extensible Firmware Interface (UEFI) code 112 is used by processor 101 to perform hardware initialization during the IHS booting process, and EC firmware 113 holds instructions that are loaded into RAM portion 109 of EC 107 for execution by EC 107.

In various embodiments, IHS 100 may be configured to implement different hardware-level trust policies for ROM and RAM code that is executed by EC 107. Particularly, ROM code in portion 108 of EC 107 may be deemed trusted, whereas RAM code in portion 109 of EC 107 may be deemed not trusted.

Techniques described herein allow EC 107 to access SPI flash 110 over SPI bus 122-123 only while commands stored in ROM portion 108 are being executed. During this phase, EC 107 fetches instructions stored in SPI flash 110's EC firmware 113, and stores those instructions in RAM portion 109. Before EC 107 begins executing the newly fetched commands or instructions now stored in RAM portion 109, EC SPI bus 121 between EC 107 and SPI flash 110 is blocked or closed via circuit 116 (FIG. 2), and/or using internal EC logic (FIG. 3), and from that point on EC 107 can access SPI flash 110 (in a shared manner with other IHS components) exclusively over eSPI bus 120 provided by module 114 of PCH 102.

It should be noted that, although EC RAM code may be encrypted and authenticated for initial boot, hardware protection against unauthorized and unlimited access to SPI Flash 110, as described herein, promotes a higher level of security without extra silicon overhead. As such, systems and methods described herein can cover security attack surfaces where a misfeasor may inject code into RAM portion 109 of EC 107 (e.g., buffer overflow) to be run after EC 107 has already booted and authenticated its original code.

In various embodiments, IHS 100 may not include each of the components shown. Additionally, or alternatively, IHS 100 may include components other than those that are shown (e.g., additional storage and user interface devices, Super I/O controllers, USB ports, etc.). Furthermore, some of the components that are represented as separate components may, in some implementations, be integrated with other components. In various embodiments, all or a portion of the functionality provided by the illustrated components may instead be provided by components integrated into processor 101 as a system-on-a-chip (SOC) or the like.

FIG. 2 illustrates an example of method 200 for securely sharing SPI flash 110 between EC 107 and a PCH 102 using multiplexing circuitry 116. In various embodiments, circuitry 116 may be configured to cut off—in hardware—access to SPI flash 110 immediately after code stored in ROM portion 108 of EC 107 has finished execution, and prior to running any instructions stored in RAM portion 109.

A non-limiting implementation of circuit 116 includes multiplexer (MUX) 117, counter 118, and/or flip-flop or latch 119, coupled as shown.

At block 201, PCH 102 is held in a reset state (e.g., during IHS power-up, boot, and/or in response to a "soft" or "hard" reset), and MUX 117 couples EC 107 to SPI flash 110 via EC SPI bus 122 and muxed SPI bus 123. At block 202, EC 107 executes instructions in ROM portion 108, and MUX 117 initially maintains EC 107's access to SPI flash 100 over the EC SPI bus 122 and muxed SPI bus 123 under control of a signal output by flip-flop 119.

A circuit select (CS) or clock (CLK) signal is fed into the input of counter 118, and EC 107 has a reset port into counter 118.

At block 203, method 200 determines whether a number of threshold circuit selections (e.g., indicating the number of times that SPI flash 110 has been accessed by any device) or clock periods corresponding to the execution of instructions in ROM portion 108 by EC 107 has been exceeded. If not, counter 118 continues incrementing its value.

If, however, at block 204 the threshold number of clock periods is met, this indicates that EC 107 is about to begin executing instructions in RAM portion 109. In that case, at block 205, method 200 allows access to SPI flash 110 by EC 107 only over eSPI bus 120 (via a secure path internal to PCH 102 between eSPI module 114 and SPI module 115), but it cuts off all access to SPI flash 110 by EC 107 over EC SPI bus 122.

Figure 3:
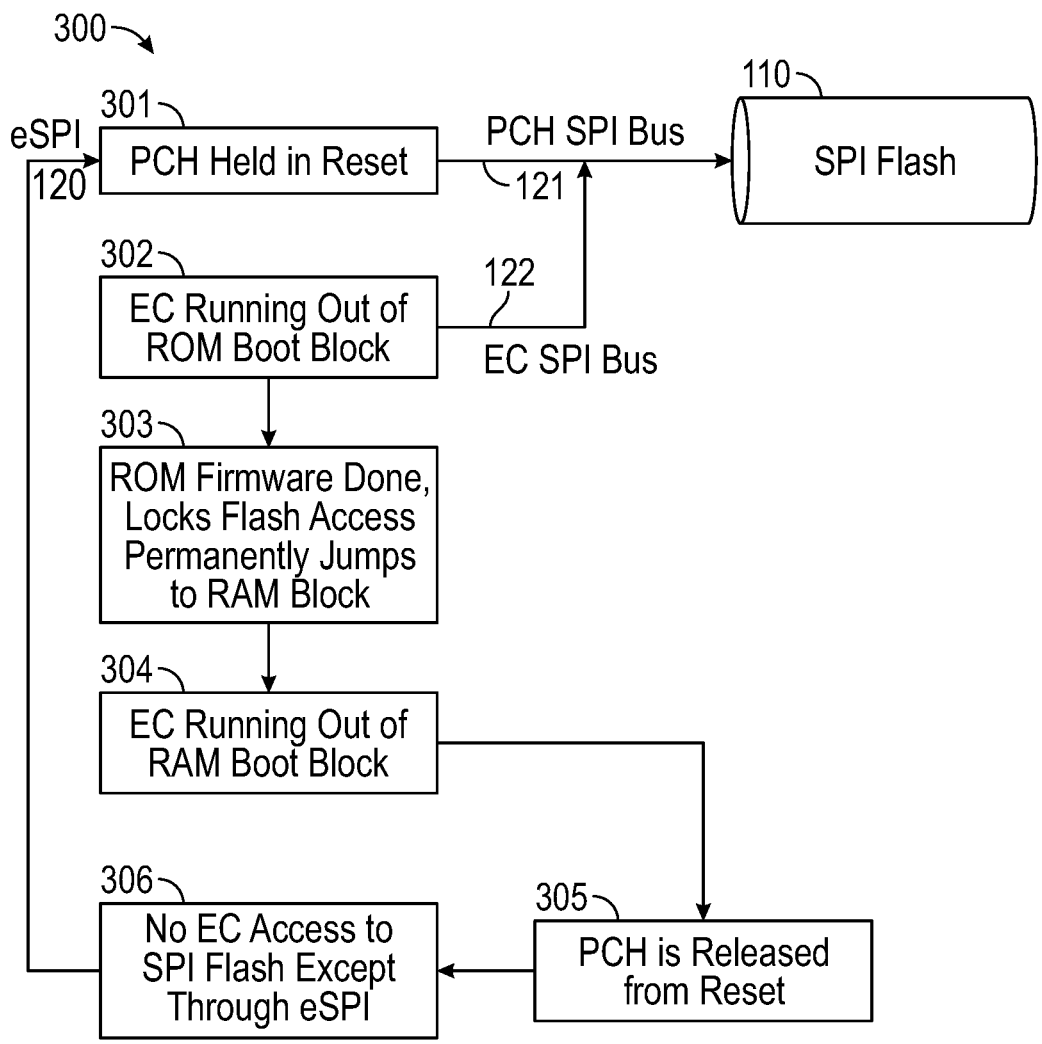
FIG. 3 illustrates an example of a method for securely sharing a memory between an EC and a PCH using internal logic, according to some embodiments.

FIG. 3 illustrates an example of a method for securely sharing a memory between an EC and a PCH using internal logic. In this embodiment, the EC 107's native hardware is enabled to cut off access to SPI flash 110, in a sharing mode, prior to EC 107 jumping from the ROM code to the RAM code. For example, in some cases, EC 107 may be configured to tri-state the SPI flash 110 signals at the end of the RAM code fetch, and to cut off any future access to SPI flash 110 by EC 107 until the next EC hard reset or power cycle.

At block 301, PCH 102 is held in reset and EC 107 has access to SPI flash 110 over EC SPI bus 122 while executing ROM code (e.g., to fetch RAM code that will then be stored in RAM portion 109). At block 302, EC 107 reaches the last instruction of ROM portion 108, which causes block 303 to lock EC SPI bus 122 prior to EC 107 executing any instruction in RAM portion 109. At block 304, method 300 determines that EC 107 is finished executing all instructions in RAM portion 109. Block 305 releases PCH 102 from reset, and block 306 allows no EC access to SPI flash 110 other than over eSPI bus 120.

In various embodiments, holding PCH 102 in reset effectively tri-states the PCH SPI Bus 121 GPIOs, thus avoiding hardware pin contention when EC 107 is accessing SPI Flash 110; without the need for a an external hardware multiplexer.

Although a direct SPI connection between EC 107 and SPI flash 110 is cut off at block 305, EC 107 can still access SPI flash 110 (later on in the boot process) once PCH 102 has been powered up. At that point, all of the internal PCH address protections put between eSPI module 114 and SPI module 115 are in place. Moreover, method 300 also helps cover cases where EC 107 does not have additional firmware encryption/authentication in the ROM bootblock.

In yet another embodiment, techniques may be used by EC 107 to authenticate and recover the BIOS firmware 112 (or other SPI Flash components like ME) in case the latter fails authentication. A similar security separation line between ROM and RAM execution by EC 107 can provide flexibility in pre-x86 RAM code to execute "EC boot guard" operations prior to transferring control to the x86 primary processor domain (e.g., processor 101). Before allowing the x86 code to boot and execute BIOS block 112, EC boot guard firmware block in RAM may, for example, write a one-way register in EC 107 preventing unlimited access to the SPI Flash 110, similarly as described above.

This effectively provides a trusted software boundary layer at the EC that operates prior to any untrusted x86 code such that full plenary access to the SPI Flash is available prior to the system primary CPU(s) running (e.g., processor 101), and that unlimited access is cut off just prior to x86 CPU run-time. EC measurement of the x86 firmware components may provide root of trust functionality. Moreover, turning off EC access to the flash device once or immediately prior to when x86 code starts execution can prevent untrusted x86 code from modifying other code (e.g., EC code) and/or from bypassing protections otherwise imposed by the PCH (e.g., as part of the eSPI protocol).

In various implementations, systems and methods described herein may be integrated into a single chip. For example, fuse technology may allow configuring the single chip in one of two possible security models. In the first security model, (a) EC firmware in ROM bootblock may toggle a correct bit in their internal registers at the end of its execution just prior to giving control to the RAM portion of the code, with that bit blocking any further access to the SPI flash via the "G3 sharing" method until the next EC power cycle, where the ROM boot block fetches the code again; (b) the silicon peripheral being locked out is the SPI Flash register set that allows EC to talk to the SPI Flash via G3 sharing path; and (c) at run-time, the eSPI access is still allowed as before.

In a second security model (mutually exclusive of the first option on the same chip), EC firmware in ROM bootblock may transfer control to trusted RAM code that has been "measured" to be authentic. That trusted RAM code can then toggle a one-way register bit that will block access to the SPI Flash until the next EC power cycle. The same peripheral is being blocked as in the first security model above, but the difference is that now the RAM code is locking out further access rather than the end of the ROM code. And again, run-time eSPI access is allowed.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a chipset;
a flash device coupled to the chipset;
an Embedded Controller (EC) coupled to the flash device via a first bus and to the chipset via a second bus, wherein the EC comprises a Read-Only Memory (ROM) portion and a Random Access Memory (RAM) portion, the EC configured to:
retrieve EC firmware from the flash device via the first bus;
store the retrieved EC firmware in the RAM portion; and
prior to execution of the retrieved EC firmware stored in the RAM portion, block access to the flash device by the EC via the first bus; and
counter circuitry coupled to the EC, the counter circuitry configured to block EC access to the flash device via the first bus after passing of a selected number of clock cycles corresponding to a number of clock cycles of a ROM execution phase.

2. The IHS of claim 1, wherein the chipset is a Platform Controller Hub (PCH).

3. The IHS of claim 1, wherein the first bus is a Serial Peripheral Interface (SPI) bus, and wherein the second bus is an Enhanced SPI bus (eSPI).

4. The IHS of claim 1, wherein the EC firmware comprises: (i) trusted EC code; and (ii) untrusted processor code.

5. The IHS of claim 1, further comprising multiplexing circuitry configured to control access by the EC to the flash device over the first bus.

6. The IHS of claim 1, wherein the EC is further configured to, after termination of the ROM execution phase, and prior to any subsequent power-up cycle, access the flash device exclusively via the second bus through the chipset.

7. A hardware memory device having program instructions stored thereon that, upon execution by an Embedded Controller (EC) of an Information Handling System (IHS), cause the EC to:
retrieve EC firmware stored on a flash device coupled to the EC, wherein the EC firmware is retrieved via a first bus and stored to a Random Access Memory (RAM) portion of the EC;
execute the retrieved EC firmware; and
block access to the flash device by the EC via the first bus prior to execution of the retrieved EC firmware, wherein counter circuitry coupled to the EC is configured to block EC access to the flash device via the first bus after passing of a selected number of clock cycles corresponding to a number of clock cycles of an execution phase of a ROM of the EC.

8. The hardware memory device of claim 7, wherein the EC is coupled to a chipset via a second bus, wherein the chipset is coupled to the flash device, and wherein the program instructions, upon execution, further cause the EC to, after blocking of access to the flash device via the first bus, access the flash device exclusively via the second bus.

9. The hardware memory device of claim 8, wherein the first bus is a Serial Peripheral Interface (SPI) bus, and wherein the second bus is an Enhanced SPI bus (eSPI).

10. The hardware memory device of claim 7, wherein the IHS further comprises multiplexing circuitry configured to control access by the EC to the flash device over the first bus.

11. A method, comprising:
retrieving Embedded Controller (EC) firmware stored on a flash device coupled to the EC, wherein the EC firmware is retrieved via a first bus and stored to a Random Access Memory (RAM) portion of the EC;
executing the EC firmware; and
blocking access to the flash device by the EC via the first bus prior to execution of the EC firmware, wherein counter circuitry coupled to the EC is configured to block EC access to the flash device via the first bus after passing of a selected number of clock cycles corresponding to a number of clock cycles of an execution phase of a ROM of the EC.

12. The method of claim 11, wherein the EC is coupled to a chipset via a second bus, wherein the chipset is coupled to the flash device, and wherein the method further comprises, during execution of the EC firmware, accessing the flash device exclusively via the second bus.

13. The method of claim 12, wherein the first bus is a Serial Peripheral Interface (SPI) bus, and wherein the second bus is an Enhanced SPI bus (eSPI).

14. The method of claim 11, further comprising controlling access by the EC to the flash device over the first bus via multiplexing circuitry.

* * * * *